(12) United States Patent
Toh et al.

(10) Patent No.: US 9,064,803 B2
(45) Date of Patent: Jun. 23, 2015

(54) SPLIT-GATE FLASH MEMORY EXHIBITING REDUCED INTERFERENCE

(75) Inventors: Eng Huat Toh, Singapore (SG); Shyue Seng (Jason) Tan, Singapore (SG); Elgin Quek, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 90 days.

(21) Appl. No.: 13/189,964

(22) Filed: Jul. 25, 2011

(65) Prior Publication Data

US 2013/0026552 A1    Jan. 31, 2013

(51) Int. Cl.
*H01L 21/28*    (2006.01)
*H01L 29/423*    (2006.01)
*H01L 29/788*    (2006.01)

(52) U.S. Cl.
CPC .... *H01L 21/28273* (2013.01); *H01L 29/42328* (2013.01)

(58) Field of Classification Search
USPC .......................................................... 257/316
See application file for complete search history.

(56) References Cited

U.S. PATENT DOCUMENTS

| | | | |
|---|---|---|---|
| 6,764,966 B1 * | 7/2004 | En et al. .................... | 438/785 |
| 2002/0003268 A1 * | 1/2002 | Jan et al. .................. | 257/389 |
| 2006/0030112 A1 * | 2/2006 | Han et al. .................. | 438/303 |
| 2012/0119281 A1 * | 5/2012 | Tan et al. .................. | 257/315 |

* cited by examiner

*Primary Examiner* — Zandra Smith
*Assistant Examiner* — Lawrence Tynes, Jr.
(74) *Attorney, Agent, or Firm* — Ditthavong & Steiner, P.C.

(57) ABSTRACT

A split gate memory cell is fabricated with a dielectric spacer comprising a high-k material between the word gate and the memory gate stack. Embodiments include memory cells with a dielectric spacer comprising low-k and high-k layers. Other embodiments include memory cells with an air gap between the word gate and the memory gate stack.

12 Claims, 8 Drawing Sheets

SPLIT-GATE FLASH MEMORY EXHIBITING REDUCED INTERFERENCE

TECHNICAL FIELD

The present disclosure relates to flash memory devices with reduced interference. The present disclosure is particularly applicable to flash memory devices for 32 nanometer (nm) technologies and beyond.

BACKGROUND

Figure 1A:
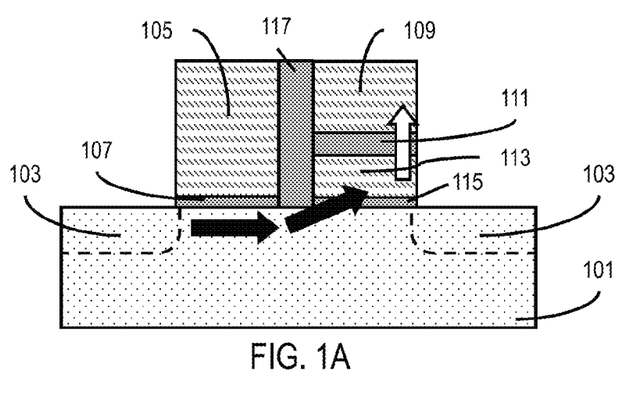
FIGS. 1A and 1B schematically illustrate a conventional split-gate non-volatile memory device.
Figure 1B:
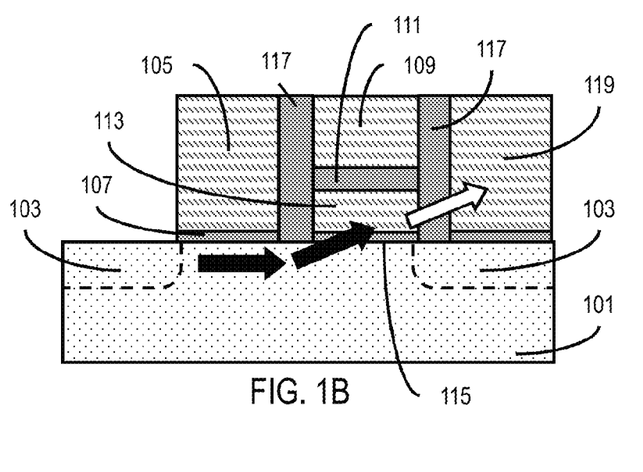

Split-gate flash technology has been widely employed in medium-low density applications. As shown in FIG. 1A, an example of such a structure includes a substrate 101 with source/drain regions 103, a word gate (WG) 105 (over a gate dielectric layer 107), a control gate (CG) 109 on a interpoly dielectric (IPD) layer 111 over a floating gate (FG) 113 and a tunneling oxide (TO) layer 115, and a spacer 117. As another example, FIG. 1B illustrates a structure including the substrate 101 with the source/drain regions 103, the word gate 105 (over the gate dielectric layer 107), the control gate 109 on the interpoly dielectric layer 111 over the floating gate 113 and the tunneling oxide layer 115, and the spacer 117. The structure shown in FIG. 1B also includes an erase gate (EG) 119. As illustrated in FIG. 1A and 1B, source-side injection (SSI) may be employed to program the exemplary structures (e.g., programming represented by black arrows). As illustrated in FIG. 1A and 1B, a Fowler-Nordheim (FN) erase may be accomplished through the control gate 109 (e.g., white arrow in FIG. 1A) or through the erase gate 119 (e.g., white arrow in FIG. 1B) to remove the charges.

Figure 2A:
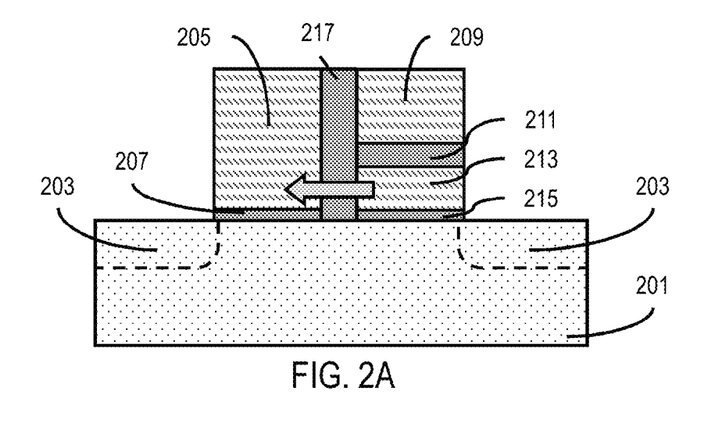
FIGS. 2A and 2B schematically illustrate read/program disturbances associated with a conventional split-gate non-volatile memory device.
Figure 2B:
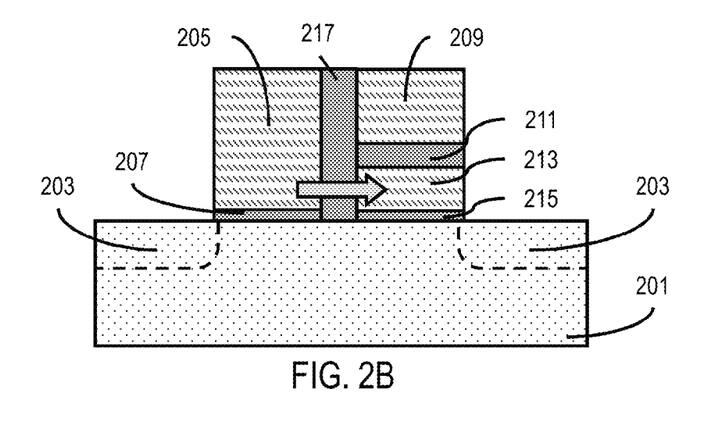

Conventional split-gate flash memory structures are problematic in various respects, such as read disturbance, program disturbance, and sidewall scaling limitations. For example, the structures illustrated in FIGS. 2A and 2B are similar to that shown in FIG. 1A, and comprise a substrate 201 with source/drain regions 203, a word gate 205 (over a gate dielectric 207), a control gate 209 on a interpoly dielectric layer 211 over a floating gate 213 and a tunneling oxide layer 215, and a spacer 217. In FIG. 2A, charge is lost from the floating gate 213 to the word gate 205, thereby causing a read disturbance. In FIG. 2B, charge is leaked from the word gate 205 to the floating gate 213, thereby causing a program disturbance. Although read/program disturbance may be prevented by increasing the width of spacer 217, such an approach adversely impacts packing density and restricts further sidewall scaling.

A need therefore exists for flash memory devices exhibiting reduced interference and further sidewall scaling, and for enabling methodology.

SUMMARY

An aspect of the present disclosure is a method of fabricating a memory device exhibiting reduced interference.

Another aspect of the present disclosure is a memory device exhibiting reduced interference.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: providing a memory gate stack over a substrate; providing a word gate over the substrate; and providing a dielectric spacer between the word gate and the memory gate stack, the dielectric spacer comprising a low-k layer and a first high-k layer.

Aspects of the present disclosure include providing the dielectric spacer such that the first high-k layer is proximate a first side surface of the memory gate stack. Embodiments include providing a work function tuning layer between the memory gate stack and the first high-k layer. Other embodiments include providing an additional work function tuning layer between the low-k layer and the first high-k layer and/or between the word gate and the low-k layer. Another aspect of the present disclosure includes providing the dielectric spacer with a second high-k layer proximate the word gate. In other embodiments, a work function tuning layer may be provided between the memory gate stack and the first high-k layer and/or between the word gate and the second high-k layer. In some embodiments, a work function tuning layer may also be provided between the low-k layer and the first high-k layer and/or between the low-k layer and the second high-k layer. In further embodiments, the work function tuning layer may be the first high-k layer and/or the second high-k layer themselves.

Further aspects of the present disclosure include removing the dielectric spacer to form a first air gap between the word gate and the memory gate stack. Another aspect includes providing a second dielectric spacer comprising a low-k layer and a high-k layer proximate a second side surface of the memory gate stack. Yet another aspect includes removing the second dielectric spacer to form a second air gap.

Other aspects include: providing the memory gate stack over the substrate; providing the dielectric spacer on opposite side surfaces of the memory gate stack, the dielectric spacer comprising the first high-k layer proximate the opposite side surfaces of the memory gate stack and the low-k layer; and providing the word gate. In various embodiments, the dielectric spacer may be provided by: depositing a high-k material; depositing a low-k material; and etching to form the dielectric spacer. In various other embodiments, the dielectric spacer may be provided by: depositing a high-k material; etching to form the first high-k layer; depositing a low-k material; and etching to form the low-k layer. In some embodiments, the dielectric spacer may comprise a second high-k layer proximate the word gate.

An additional aspect of the present disclosure is a device including: a memory gate stack over a substrate; a word gate over the substrate; and a first dielectric spacer between the word gate and the memory gate stack, the dielectric spacer comprising a low-k layer and a first high-k layer.

Aspects include a device having the first high-k layer proximate to a first side surface of the memory gate stack. In various embodiments, there may be a work function tuning layer between the memory gate stack and the first high-k layer. In other embodiments, the work function tuning layer may also be between the low-k layer and the first high-k layer and/or between the word gate and the low-k layer. Another aspect includes a dielectric spacer comprising a second high-k layer proximate the word gate. In some embodiments, there may be a work function tuning layer between the memory gate stack and the first high-k layer and/or between the word gate and the second high-k layer. In other embodiments, a work function tuning layer may also be between the low-k layer and the first high-k layer and/or between the low-k layer and the second high-k layer. In further embodiments, the work function tuning layer may be the first high-k layer and/or the second high-k layer themselves. Further aspects include a device having a second dielectric spacer comprising a high-k layer proximate the second side surface of the memory gate stack and a low-k layer.

Another aspect of the present disclosure is a device including: a memory gate stack over a substrate; a word gate over the substrate; and a first air gap between the word gate and a first side surface of the memory gate stack. Other aspects include a device having a second air gap proximate a second side surface of the memory gate stack.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of read/program disturbances and sidewall scaling limitations attendant upon conventional flash memory devices, notably split-gate flash memory devices. In accordance with embodiments of the present disclosure, a dielectric spacer comprising a low-k layer and a first high-k layer is provided between a word gate and a memory gate stack. The dielectric spacer may further comprise a second high-k layer. It was found that a multi-layer dielectric spacer reduces interference between the word gate and the memory gate stack, and further allows for sidewall scaling. In addition, the dielectric spacer (or any other spacer between the word gate and the memory gate stack) may be removed to form a first air gap. The air gap prevents potential leakage paths due to, for example, interface traps, trapped charges, and defects, thereby minimizing charge transfer between the word gate and the memory gate stack (via the floating gate). Accordingly, interference between the word gate and the memory gate stack is also reduced.

Figure 3A:
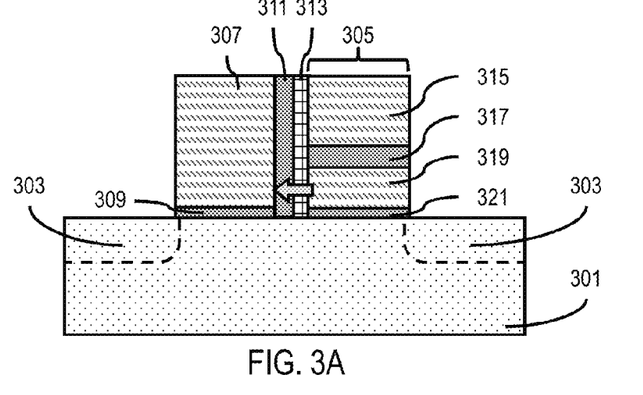
FIGS. 3A through 3D schematically illustrate a split-gate structure with a dual-layer spacer along with associated diagrams in accordance with an embodiment of the present disclosure.
Figure 3B:
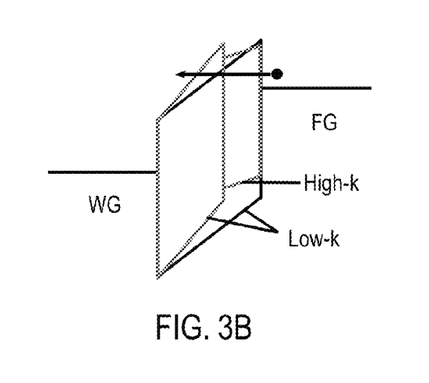
Figure 3C:
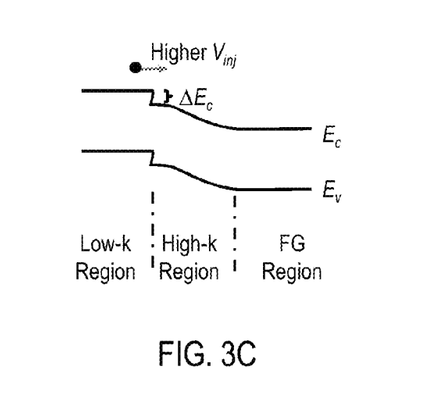

FIGS. 3A through 3C schematically illustrate a split-gate structure with a dual-layer spacer along with associated diagrams in accordance with an embodiment of the present disclosure. In FIG. 3A, the split-gate structure comprises a substrate 301, source/drain regions 303, a memory gate stack 305, a word gate 307, a gate dielectric layer 309, a low-k layer 311, and a high-k layer 313. Memory gate stack 305 comprises a control gate 315, an interpoly dielectric layer 317, a floating gate 319, and a tunneling oxide layer 321. As also shown in FIG. 3A, the low-k layer 311 and the high-k layer 313 form a dielectric spacer between the word gate 307 and the memory gate stack 305. Low-k material may have a dielectric constant of about 4 or less, while high-k material may have a dielectric constant k of about 5 or more, based on a k value of 1 for a vacuum. The low-k layer 311 may, for instance, include hydrogen-containing silicon oxycarbide (SiCOH), hydrogen silsesquioxane (HSQ), FLARE 2.0™, a poly(arylene)ether (available from Advanced Microelectronic Materials Division, Allied-Signal, Sunnyvale, Calif.), Black Diamond™ (available from Applied Materials, Santa Clara, Calif.), BCB (divinylsiloxane bis-benzocyclobutene), FO.sub.x™, (HSQ-based), XLK™ (HSQ-based), and SiLK™, an aromatic hydrocarbon polymer (each available from Dow Chemical Co., Midland, Mich.), Coral™, a carbon-doped silicon oxide (available from Novellus Systems, San Jose, Calif.), HOSP™, a hybrid siloxane-organic polymer, and Nanoglass™, a nanoporous silica (each available from Honeywell Electronic Materials), halogen-doped (e.g., fluorine-doped) silicon dioxide derived from tetraethyl orthosilicate (TEOS) and fluorine-doped silicate glass (FSG), etc. The high-k layer 313 may, for instance, include aluminum oxide, hafnium oxide, zirconium oxide, lanthanum oxide, titanium oxide, tantalum oxide, tungsten oxide, cerium oxide, yttrium oxide, zirconium silicate, hafnium silicate, hafnium aluminate, lanthanum aluminate, lead titanate, barium titanate, strontium titanate, barium strontium titanate, lead zirconate, ferroelectric oxides, ternary metal oxides, PST (PbSc$_x$Ta$_{1-x}$O$_3$), PZN (PbZn$_x$Nb$_{1-x}$O$_3$), PZT (PbZr$_x$Ti$_{1-x}$O$_3$), and PMN (PbMg$_x$Nb$_{1-x}$O$_3$).

Figure 3D:
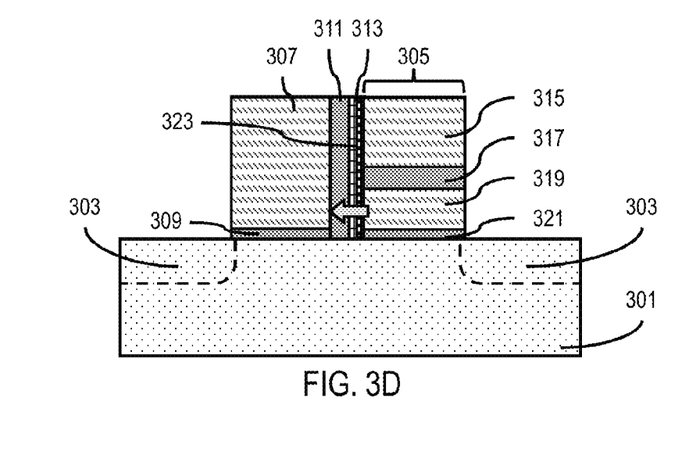

As depicted in FIG. 3B, the dielectric spacer formed by the low-k layer 311 and the high-k layer 313 results in a larger tunneling width, as compared with a single low-k dielectric layer. The multi-layer dielectric spacer decreases charge loss or leakage from the floating gate 319 to the word gate 307, thereby reducing read disturbance. In addition, incorporating the high-k layer 313 in the dielectric spacer between the word gate 307 and the memory gate stack 305 also reduces series resistance, as by increasing coupling to the channel. As illustrated in FIG. 3C, a band offset exists in the channel under the low-k layer 311 and the high-k layer 313 as a result of the higher potential in the region under the high-k layer 313 due to more effective coupling of the high-k layer 313 over the low-k layer 311. Thus, the energy of the carriers is improved, resulting in improved source-side injection or channel hot electron. Further, as shown in FIG. 3D, a work function tuning layer 323 may be provided between the high-k layer 313 and the memory gate stack 305, which may further reduce leakage from the floating gate 319 to the word gate 307. The work function tuning layer 323 may, for instance, include tantalum (Ta), tungsten (W), titanium nitride (TiN), tantalum nitride (TaN), etc. The high-k layer 313 could also by itself be the work function tuning layer 323. For example, poly on high-k material like $HFO_2$ would shift the work function.

Figure 4A:
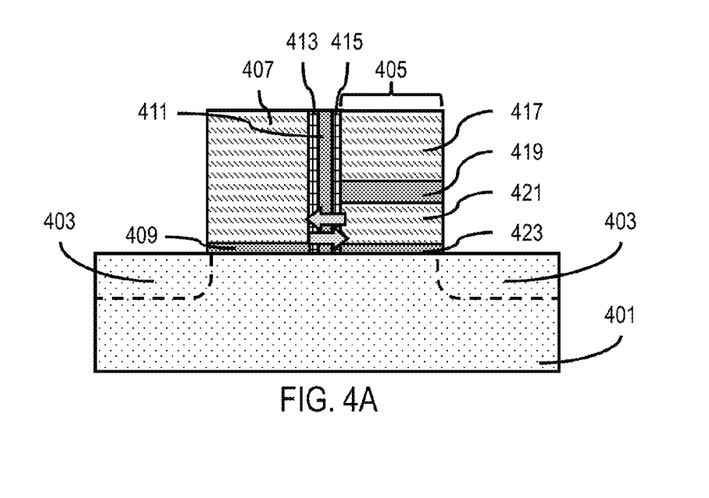
FIGS. 4A through 4D schematically illustrate a split-gate structure with a tri-layer spacer along with associated diagrams in accordance with an embodiment of the present disclosure.
Figure 4B:
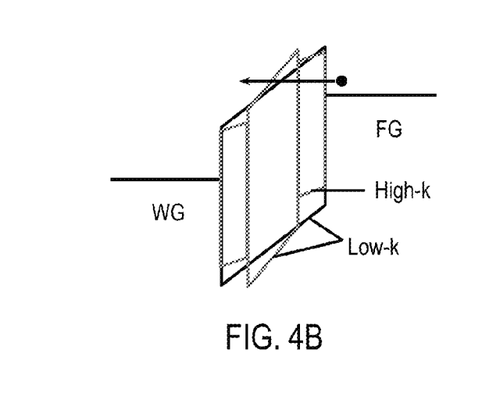
Figure 4C:
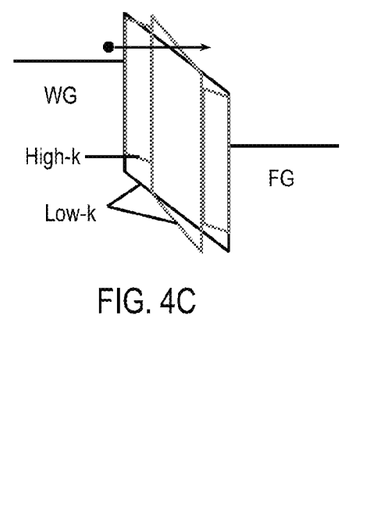

FIGS. 4A through 4C schematically illustrate a split-gate structure with a tri-layer spacer along with associated diagrams in accordance with an embodiment of the present disclosure. As shown in FIG. 4A, the split-gate structure comprises a substrate 401, source/drain regions 403, a memory gate stack 405, a word gate 407, a gate dielectric layer 409, a low-k layer 411, and high-k layers 413 and 415. Memory gate stack 405 comprises a control gate 417, an interpoly dielectric layer 419, a floating gate 421, and a tunneling oxide layer 423. The low-k layer 411 and the high-k layers 413 and 415 form a dielectric spacer between the word gate 407 and the memory gate stack 405.

Figure 4D:
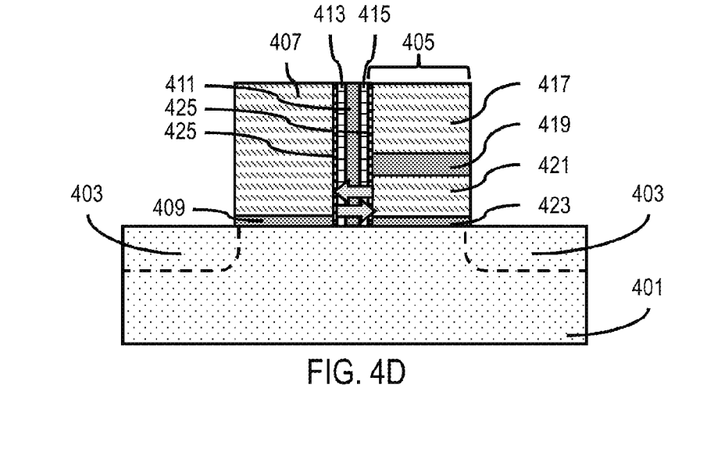

As illustrated in FIG. 4B, the tri-layer dielectric spacer, comprising the low-k layer 411 and the high-k layers 413 and 415, increases the tunneling width. The use of a multi-layer dielectric spacer decreases the charge loss from the floating gate 421 to the word gate 407, thereby reducing read disturbance. As shown in FIG. 4C, the wider tunneling width also reduces leakage from the word gate 407 to the floating gate 421, thereby reducing program disturbance. In addition, as in the structure shown in FIG. 3A, the incorporation of the high-k layers 413 and 415 in the dielectric spacer between the word gate 407 and the memory gate stack 405 reduces series resistance by having a higher coupling effect to the channel. In addition, improved source-side injection and channel hot electron is achieved due to the band offset in the channel under the dielectric spacer. Further, as shown in FIG. 4D, a work function tuning layer 425 may be provided between the high-k layer 413 and the word gate 407 and/or between the high-k layer 415 and the memory gate stack 405. The work function tuning layer 425 further reduces leakage from the floating gate 419 to the word gate 407.

Figure 5A:
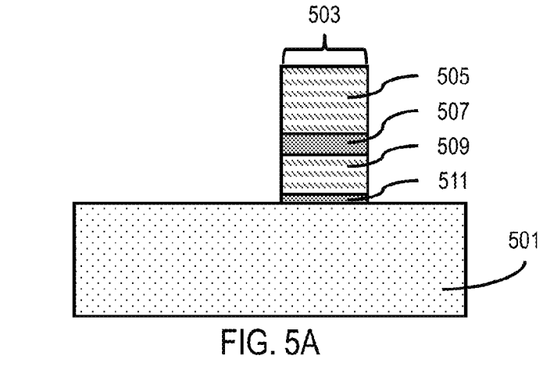
FIGS. 5A through 5C schematically illustrate a process flow for forming a split-gate structure with a dual-layer or tri-layer spacer in accordance with an embodiment of the present disclosure.
Figure 5B:
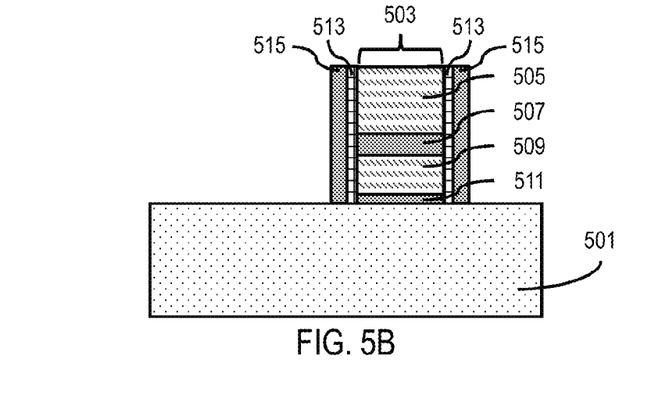
Figure 5C:
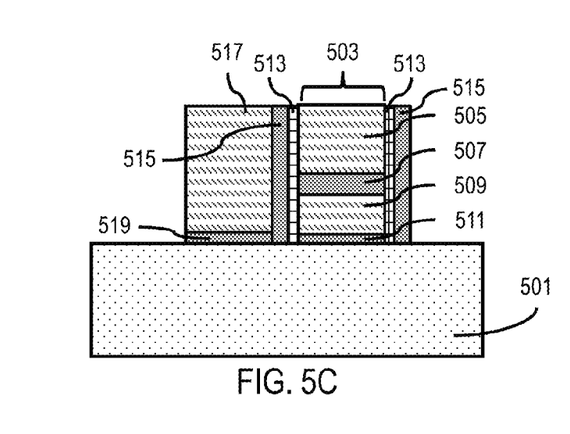

FIGS. 5A through 5C schematically illustrate a process flow for forming a split-gate structure with a dual-layer or tri-layer spacer in accordance with an embodiment of the present disclosure. Adverting to FIG. 5A, after standard isolation and well implantation (not shown for illustrative convenience) are performed in substrate 501, a memory gate stack 503 is provided. For example, the memory gate stack 503 may be provided by forming a control gate 505, an interpoly dielectric layer 507, a floating gate 509, and a tunneling oxide layer 511. Subsequently, as shown in FIG. 5B, dielectric spacers comprising a high-k layer 513 and a low-k layer 515 are provided on opposite side surfaces of memory gate stack 503. Alternatively, as illustrated in FIG. 4A, the dielectric spacers may also comprise another high-k layer (e.g., to form a tri-layer dielectric spacer). Thereafter, a word gate 517 and a gate dielectric layer 519 are provided. In addition, chemical mechanical polishing may be performed to planarize the surfaces.

Figure 6A:
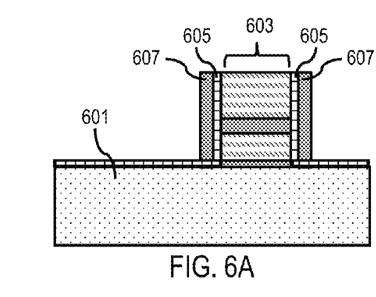
FIGS. 6A through 6G schematically illustrate a process flow for providing a dielectric spacer of a split-gate structure in accordance with an embodiment of the present disclosure.
Figure 6B:
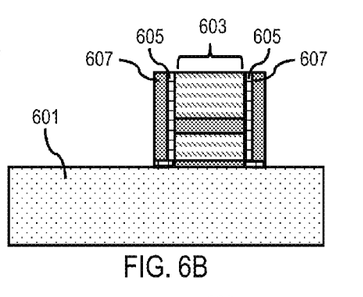
Figure 6C:
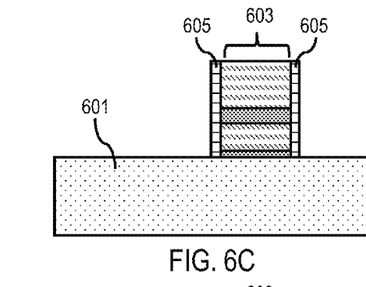
Figure 6D:
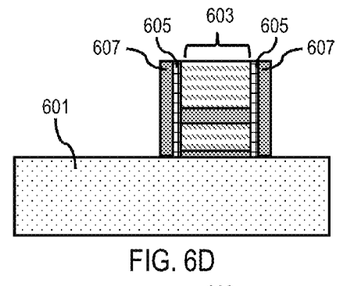
Figure 6E:
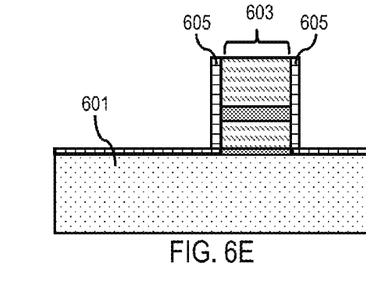
Figure 6F:
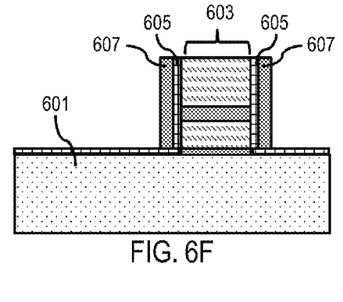
Figure 6G:
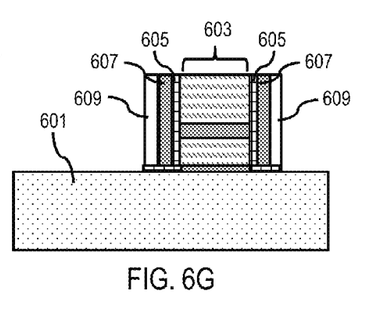

FIGS. 6A through 6G schematically illustrate process flows for providing a dielectric spacer of a split-gate structure in accordance with an embodiment of the present disclosure. For example, FIGS. 6A and 6B illustrate a first process flow, FIGS. 6C and 6D illustrate a second process flow, and FIGS. 6E through 6G illustrate a third process flow. It is noted that, prior to FIGS. 6A, 6C, and 6E, the steps illustrated in FIG. 5A are already performed (e.g., providing a substrate 601 and a memory gate stack 603). In the first process flow illustrated in FIG. 6A, a conformal high-k layer 605 is deposited, followed by depositing conformal low-k layer 607. Etching is then conducted resulting in the intermediate structure illustrated in FIG. 6B. In the second process flow illustrated in FIG. 6C, a high-k material is first deposited and etched to form the high-k layers 605. Then, as shown in FIG. 6D, a low-k material is deposited and etched to form the low-k layers 607. In the third process flow illustrated in FIG. 6E, a conformal high-k layer 605 is deposited, and a conformal low-k layer 607 deposited thereon. Etching is then conducted resulting in the intermediate structure illustrated in FIG. 6F. Thereafter, disposable spacers 609 are formed as shown in FIG. 6G. After any of the three process flows, a word gate may be provided. As an example, a gate dielectric layer may be deposited or grown, followed by word gate material deposition and chemical mechanical planarization. The word gate may be defined by lithography and etched, followed by standard source/drain formation and back-end-of-line (BEOL) processes.

Figure 7:
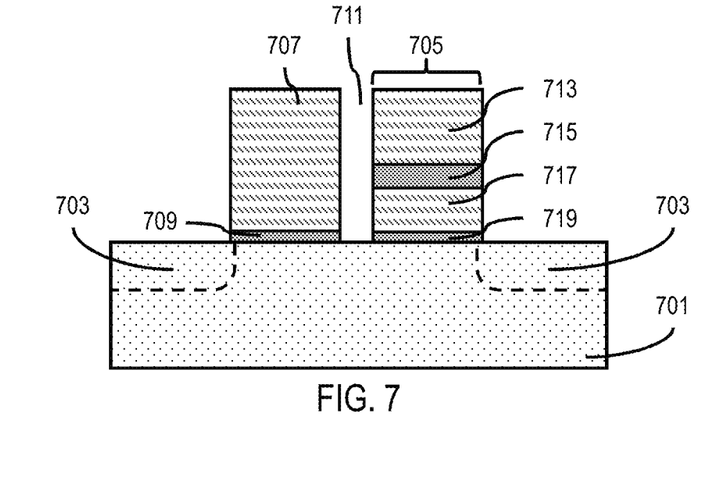
FIG. 7 schematically illustrates a split-gate structure with an air gap in accordance with an embodiment of the present disclosure.

FIG. 7 schematically illustrates a split-gate structure with an air gap in accordance with an embodiment of the present disclosure. In FIG. 7, the split-gate structure comprises a substrate 701, source/drain regions 703, a memory gate stack 705, a word gate 707 over a gate dielectric layer 709, and an air gap 711. Memory gate stack 705 comprises a control gate 713, an interpoly dielectric layer 715, a floating gate 717, and a tunneling oxide layer 719. The air gap 711 replaces a dielectric spacer (or other materials) that may have otherwise existed between the word gate 707 and the memory gate stack 705. It was found that air gap 711 minimizes potential leakage paths between the word gate 707 and the floating gate 717, since interface traps, trapped charges, and defects are removed. As a result, leakage from the floating gate 717 to the word gate 707 is reduced, thereby lowering read disturbance. Similarly, leakage from the word gate 707 to the floating gate 717 is reduced, thereby lowering program disturbance.

Figure 8A:
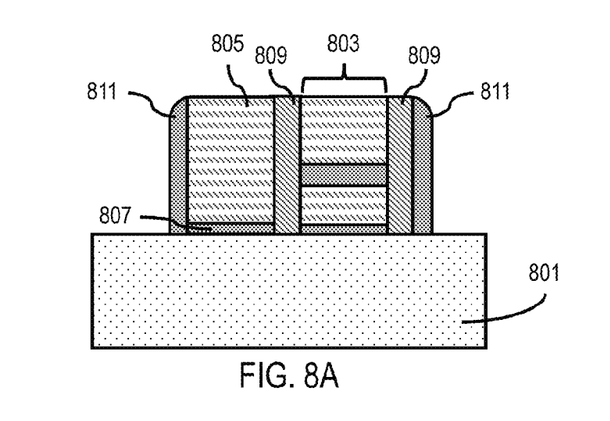
FIGS. 8A through 8C schematically illustrate a process flow for forming a split-gate structure with an air gap in accordance with an embodiment of the present disclosure.
Figure 8B:
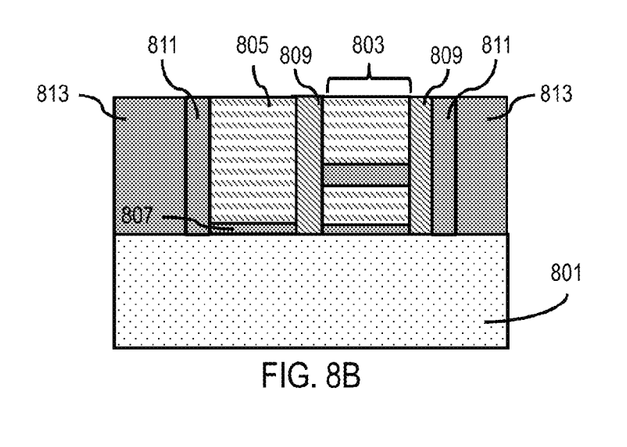
Figure 8C:
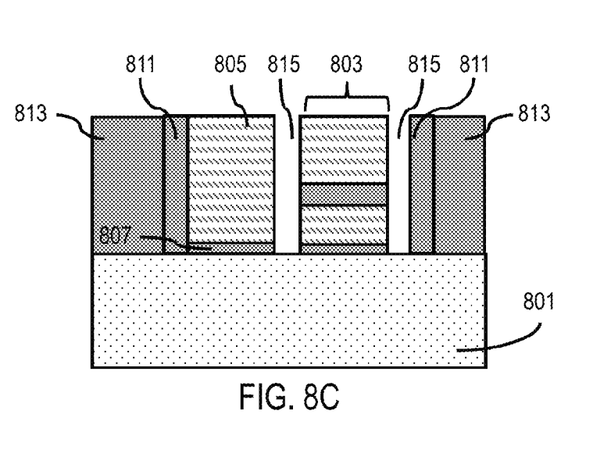

FIGS. 8A through 8C schematically illustrate a process flow for forming a split-gate structure with an air gap in accordance with an embodiment of the present disclosure. As illustrated in FIG. 8A, the structure comprising a substrate 801, a memory gate stack 803, a word gate 805, a gate dielectric layer 807, and spacers 809 and 811 may be provided via conventional procedures. Subsequently, as shown in FIG. 8B, interlayer dielectric 813 is deposited and planarized. Then, as in FIG. 8C, the spacers 809 may be removed, as by wet etching, leaving air gaps 815. Further steps, such as back-end-of-line processes, may be performed in a conventional manner.

The embodiments of the present disclosure achieve several technical effects, including reduction of read disturbance through decreased floating gate to word gate leakage, reduction of program disturbance through decreased word gate to floating gate leakage, better sidewall scaling, improved source-side injection and/or channel hot electron, and reduced series resistance. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    providing a memory gate stack over a substrate; providing a word gate over the substrate;
    and providing a dielectric spacer between the word gate and the memory gate stack, the dielectric spacer comprising a low-k layer and a first high-k layer each layer being formed on the substrate to a same height over the entire length of the low-k and first high-k layers, the dielectric spacer occupying the entire space between the memory gate stack and the word gate.

2. The method according to claim 1, comprising providing the dielectric spacer such that the first high-k layer is proximate a first side surface of the memory gate stack.

3. The method according to claim 2, comprising providing a work function tuning layer between the memory gate stack and the first high-k layer.

4. The method according to claim 1, wherein the dielectric spacer comprises a second high-k layer proximate the word gate.

5. The method according to claim 4, comprising providing a work function tuning layer between the memory gate stack and the first high-k layer and/or between the word gate and the second high-k layer.

6. The method according to claim 1, comprising removing the dielectric spacer to form a first air gap between the word gate and the memory gate stack.

7. The method according to claim 1, comprising providing a second dielectric spacer comprising a low-k layer and a high-k layer proximate a second side surface of the memory gate stack.

8. The method according to claim 7, comprising removing the second dielectric spacer to form a second air gap.

9. The method according to claim 1, comprising:
    providing the memory gate stack over the substrate; providing the dielectric spacer on opposite side surfaces of the memory gate stack, the
    dielectric spacer comprising the first high-k layer proximate the opposite side surfaces of the memory gate stack and the low-k layer; and providing the word gate.

10. The method according to claim 9, comprising: depositing a high-k material;
    depositing a low-k material; and etching to form the dielectric spacer.

11. The method according to claim 9, comprising: depositing a high-k material;
    etching to form the first high-k layer; depositing a low-k material; and etching to form the low-k layer.

12. The method according to claim 9, wherein the dielectric spacer comprises a second high-k layer proximate the word gate.

* * * * *